(12) United States Patent
Furuki et al.

(10) Patent No.: US 7,524,589 B2
(45) Date of Patent: Apr. 28, 2009

(54) HOLOGRAPHIC RECORDING MEDIUM AND RECORDING METHOD

(75) Inventors: Makoto Furuki, Ashigarakami-gun (JP); Katsunori Kawano, Ashigarakami-gun (JP); Hiroo Takizawa, Minami-Ashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 786 days.

(21) Appl. No.: 10/965,895

(22) Filed: Oct. 18, 2004

(65) Prior Publication Data

US 2005/0208388 A1 Sep. 22, 2005

(30) Foreign Application Priority Data

Mar. 22, 2004 (JP) ............................. 2004-83590

(51) Int. Cl.
*G03H 1/02* (2006.01)
(52) U.S. Cl. .................................... 430/1; 430/2; 359/3
(58) Field of Classification Search ....................... None
See application file for complete search history.

(56) References Cited

U.S. PATENT DOCUMENTS

| 3,833,383 | A | * | 9/1974 | Ryan et al. ....................... 430/2 |
| 5,240,975 | A | * | 8/1993 | Winter et al. ................... 524/91 |
| 5,384,221 | A | * | 1/1995 | Savant et al. ................... 430/19 |
| 5,633,100 | A | * | 5/1997 | Mickish et al. ................. 430/1 |
| 5,812,233 | A | * | 9/1998 | Walsh et al. .................... 349/194 |
| 7,244,532 | B2 | * | 7/2007 | Mizushima ...................... 430/1 |
| 2001/0002895 | A1 | * | 6/2001 | Kawano et al. ............... 369/103 |
| 2003/0156523 | A1 | * | 8/2003 | Wu et al. ....................... 369/103 |
| 2005/0046915 | A1 | * | 3/2005 | Takizawa et al. ............... 359/3 |
| 2005/0286386 | A1 | * | 12/2005 | Edwards et al. ............... 369/103 |

FOREIGN PATENT DOCUMENTS

| JP | 04358145 A | * 12/1992 |
| JP | A 10-340479 | 12/1998 |

OTHER PUBLICATIONS

Weiss et al., "holographic recording and all optical modulation in photochromic polymers", Opt. Lett., vol. 18(13) pp. 1089-1091 (Jun. 1993).*

* cited by examiner

*Primary Examiner*—Martin J Angebranndt
(74) *Attorney, Agent, or Firm*—Oliff & Berridge, PLC

(57) ABSTRACT

The present invention provides a holographic recording medium comprising: an optical recording layer, which optical recording layer includes one of a polymer compound having photoisomerizable groups in the side chain thereof and a polymer compound in which photoisomerizable molecules are dispersed therein, which recording layer records a hologram by having optical anisotropy induced by irradiation with a writing light having a predetermined wavelength thereon; and an optical filter layer formed on at least one side of the optical recording layer, which optical filter layer allows transmission of the writing light and a reading light having a predetermined wavelength irradiated on the optical recording layer, for reproducing the hologram recorded on the optical recording layer, therethrough and blocks light having a shorter wavelength than the wavelength of the writing light.

4 Claims, 4 Drawing Sheets

FIG. 7A BEFORE IRRADIATING POLARIZED LIGHT

FIG. 7B DURING IRRADIATION OF POLARIZED LIGHT

PUMPING LIGHT

FIG. 7C AFTER BLOCKING POLARIZED LIGHT

HOLOGRAPHIC RECORDING MEDIUM AND RECORDING METHOD

CROSS-REFERENCE TO RELATED APPLICATION

This application claims priority under 35 USC 119 from Japanese Patent Application No. 2004-83590, the disclosure of which is incorporated by reference herein.

BACKGROUND OF THE INVENTION

1. Technical Field

The present invention relates to a holographic recording medium and recording method for recording a hologram, in particular to a data-rewritable hologram recording medium and recording method.

2. Description of the Related Art

Recently holographic memories which take advantage of the high density recordability of holograms are being actively investigated for use as the next generation of high-speed, high-capacity memory. Hitherto, inorganic photorefractive crystals, typified by lithium niobate (LiNbO$_3$), have been used for recording materials in data-rewritable hologram recording media. However, refractive index changes of the inorganic photorefractive crystal are as small as 1 in 10,000, and the recording medium is forced to be as thick as 1 cm. Accordingly, it is pointed out that the material is liable to cause optical aberration and handling of the material is difficult.

In relation to the problems above, a holographic memory taking advantage of large changes in refractive index of organic polymer materials has recently attracted interest. For example, a holographic recording medium proposed in Japanese Patent Application Laid-Open (JP-A) No. 10-340479 comprises a polymer film containing a photoisomerizable molecule such as azobenzene and the like, wherein the polymer film is selectively photoisomerized by irradiation with polarized light to the photomerizable molecule, and a hologram is recorded by taking advantage of the high optical anisotropy (birefringence and dichroism) induced in the polymer film by the photoisomerization.

Azobenzene exhibits trans-cis photoisomerization under irradiation with light. The trans isomer and cis isomer are shown by the chemical formulae (a) and (b), respectively shown below:

(a)

(b)

Figure 7A:
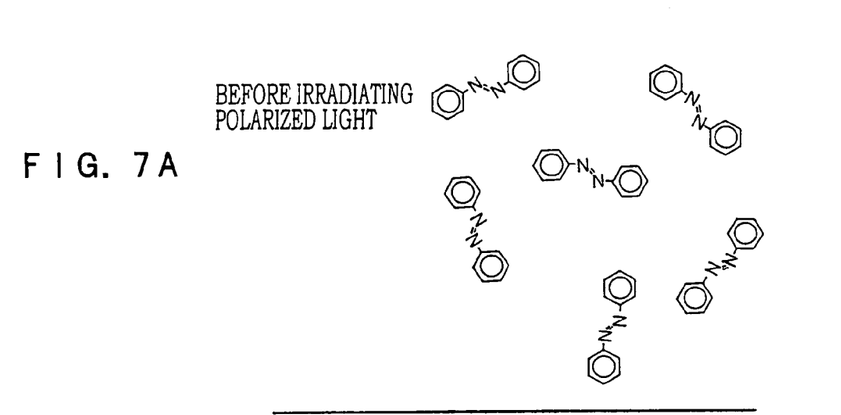
FIGS. 7A, 7B, and 7C illustrate features of the optical isomerization of azobenzene.

While azobenzene itself exhibits optical anisotropy, as shown in FIG. 7A, a polymer film, prepared by applying a polymer solution in which azobenzene is dispersed, is isotropic as a whole as a result of the isotropic conformation of the solution.

Figure 7B:
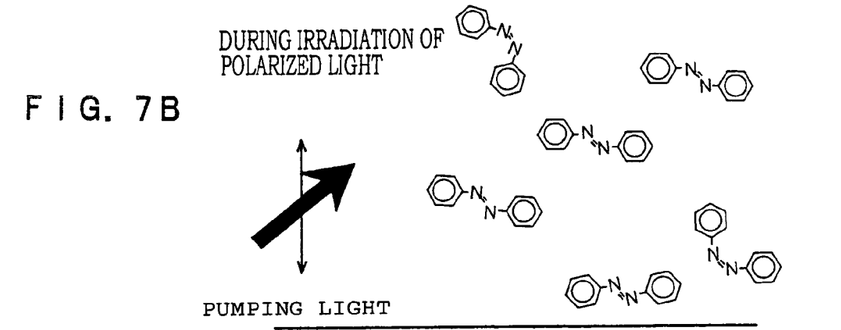

When a linearly polarized light having a wavelength sensitive to azobenzene is irradiated as a pumping light, as shown in FIG. 7B, due to dichroism of the azobenzene molecules, only azobenzene molecules oriented in the same direction as the polarization direction of the pumping light (polarization axis) absorb the light and are isomerized into cis isomers. Since the cis isomer is thermally unstable, it is isomerized back again into the trans isomer by a thermal reversion reaction. The resulting trans isomers may be oriented in either the same direction as, or perpendicular to, the polarization axis. However any trans isomers oriented in the same direction as the polarization axis are isomerized once again into the cis isomer, and then isomerized back into the trans isomer thereafter by the thermal reversion reaction.

Figure 7C:
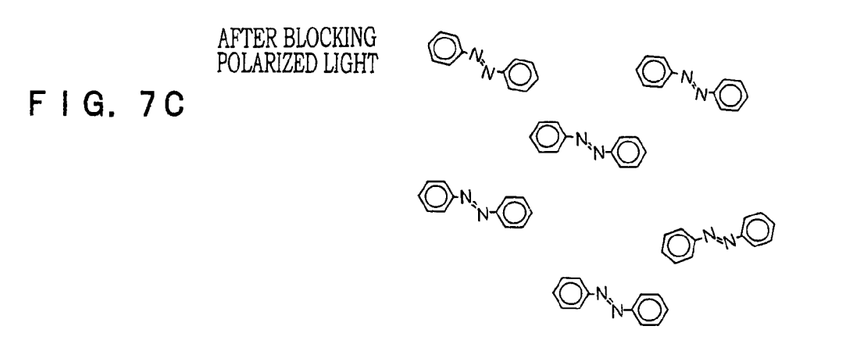

The azobenzene molecules finally become to be oriented in a direction where the molecules have a smaller light absorption ratio to the pumping light (perpendicular to the isomerization axis) as shown in FIG. 7C, by repeating trans-cis-trans isomerization cycles. Orientation of the polymer is also changed by the isomerization and orientation changes of the azobenzene molecules, whereby macro optical anisotropy is induced in the polymer film.

However, in the holographic recording medium taking advantage of the photoisomerization reaction as described above, optical anisotropy induced in the polymer film is not stabilized (i.e., a fixing process is not carried out) after recording a hologram, so that the recording medium remains rewritable. Accordingly, there arises a problem in that optical anisotropy is induced by exposing the recording medium to external light, such as the sunlight, after recording, and the recorded hologram can be destroyed.

SUMMARY OF THE INVENTION

Accordingly, the present invention has been developed in the light of the problems above and provides a holographic recording medium and a holographic recording method, which allow rewriting of data and are excellent in data retention.

In a first aspect of the invention, there is provided a holographic recording medium comprising: an optical recording layer, which optical recording layer includes one of a polymer compound having photoisomerizable groups in the side chain thereof and a polymer compound in which photoisomerizable molecules are dispersed therein, which recording layer records a hologram by having optical anisotropy induced by irradiation with a writing light having a predetermined wavelength thereon; a first optical filter layer formed on one surface of the optical recording layer, which first optical filter layer allows transmission of at least the writing light, of the writing light and a reading light having a predetermined wavelength irradiated on the optical recording layer for reproducing the hologram recorded on the optical recording layer, therethrough and blocks light having a shorter wavelength than the wavelength of the writing light; and a second optical filter layer formed on the other surface of the optical recording layer, which second optical filter layer allows transmission of at least the reading light, of the writing light and the reading light, therethrough and blocks light having a shorter wavelength than the wavelength of the reading light, wherein the wavelength of the reading light is the same as, or longer than, the wavelength of the writing light.

More specifically, there is provided a holographic recording medium comprising: an optical recording layer, which optical recording layer includes one of a polymer compound having photoisomerizable groups in the side chain thereof and a polymer compound in which photoisomerizable molecules are dispersed therein, which recording layer records a hologram by having optical anisotropy induced by irradiation with a writing light having a predetermined wavelength thereon; and an optical filter layer formed on at least one side of the optical recording layer, which optical filter layer allows transmission of the writing light and a reading light having a predetermined wavelength irradiated on the optical recording layer, for reproducing the hologram recorded on the optical recording layer, therethrough and blocks light having a shorter wavelength than the wavelength of the writing light.

The optical recording medium according to the first aspect of the invention comprises an optical recording layer, which optical recording layer includes one of a polymer compound having photoisomerizable groups in the side chain thereof and a polymer compound in which photoisomerizable molecules are dispersed therein. Therefore, a hologram can be recorded by inducing optical anisotropy by irradiation with the writing light having a predetermined wavelength, and also, rewriting of data is possible by taking advantage of reversible photoisomerization.

The optical filter layer is formed at least on one side of the optical recording layer. The optical filter layer allows transmission of the writing light and a reading light having a predetermined wavelength irradiated on the optical recording layer, for reproducing the hologram recorded on the optical recording layer, and blocks light having a shorter wavelength than the wavelength of the writing light. Therefore, light absorption ratio of the optical recording layer can be reduced, without interfering with writing and reading of the hologram. Consequently, the hologram recorded on the optical recording layer is not destroyed by external light, such as the sunlight, enabling data to be retained for a long period of time.

The optical filter layer of the holographic recording medium, as described above, may comprise an absorption filter, that selectively absorbs light having a shorter wavelength than the wavelength of the writing light. Examples of such absorption filters include glass substrates and polymer films containing light absorbing agents that selectively absorb light having a shorter wavelength than the wavelength of the writing light. UV absorbing agents and pigments may be used as the light absorbing agents. The optical filter layer may also comprise a reflection filter that selectively reflects light having a shorter wavelength than the wavelength of the writing light. An example of a reflection filter available is a dielectric multilayer film. Since reflection filters do not emit heat, they are preferable for improving data retention ability. Reflection filters are also advantageous in that transmittance at the wavelength of the transmitting light, such as the writing light, is high.

A second aspect of the invention is to provide a hologram recording medium comprising: an optical recording layer, which optical recording layer includes one of a polymer compound having photoisomerizable groups in the side chain thereof and a polymer compound in which photoisomerizable molecules are dispersed therein, which recording layer records a hologram by having optical anisotropy induced by irradiation with a writing light having a predetermined wavelength thereon; a first optical filter layer formed on one side of the optical recording layer, which first filter allows transmission of the writing light therethrough and blocks light having a shorter wavelength than the wavelength of the writing light; and a second optical filter layer formed on the other side of the optical recording layer, which second filter allows transmission of a reading light having a predetermined wavelength and irradiated on the optical recording layer, for reproducing a hologram recorded on the optical recording layer, therethrough and blocks light having a shorter wavelength than the wavelength of the reading light.

The optical recording medium according to the second aspect of the invention comprises an optical recording layer, which optical recording layer includes one of a polymer compound having photoisomerizable groups in the side chain thereof and a polymer compound in which photoisomerizable molecules are dispersed therein. Therefore, a hologram can be recorded by inducing optical anisotropy by irradiation with the writing light having a predetermined wavelength, and also, rewriting of data is possible by taking advantage of reversible photoisomerization.

The first optical filter layer is formed on one side of the optical recording layer, and the first optical filter layer allows transmission of the writing light while blocking light having a shorter wavelength than the wavelength of the writing light. Accordingly, the light absorption ratio of the optical recording layer may be reduced, without interfering with the recording of the hologram, by irradiating the writing light from the first optical filter layer side and effecting hologram recording. The second optical filter layer is formed on the other side of the optical recording layer. The second optical filter layer allows transmission of a reading light having a predetermined wavelength and irradiated on the optical recording layer, for reproducing a hologram recorded on the optical recording layer, therethrough and blocks light having a shorter wavelength than the wavelength of the reading light. Consequently, by reproducing the hologram by irradiating the reading light from the second optical filter layer side, the light absorption ratio of the optical recording layer can be reduced without interfering with reading of the hologram.

Since the light absorption ratio of the optical recording layer is reduced, by using the first optical filter layer and second optical filter layer, the hologram recorded on the optical recording layer is not destroyed by external light, such as sunlight, enabling date to be retained for a long period of time.

The invention also provides a holographic recording method comprising: forming an optical filter layer on at least one side of an optical recording layer, which optical recording layer includes one of a polymer compound having photoisomerizable groups in the side chain thereof and a polymer compound in which photoisomerizable molecules are dispersed therein; allowing, by way of the optical filter layer, transmission of a writing light having a predetermined wavelength and a reading light having a predetermined wavelength and irradiated on the optical recording layer, for reproducing a hologram recorded on the optical recording layer, while blocking, by the optical filter layer, light having a shorter wavelength than the wavelength of the writing light; and irradiating the writing light to the optical recording layer, thereby inducing optical anisotropy for recording the hologram.

DETAILED DESCRIPTION OF THE INVENTION

The holographic recording medium according to the embodiments of the present invention will be described in detail hereinafter.

FIRST EMBODIMENT

Figure 1:
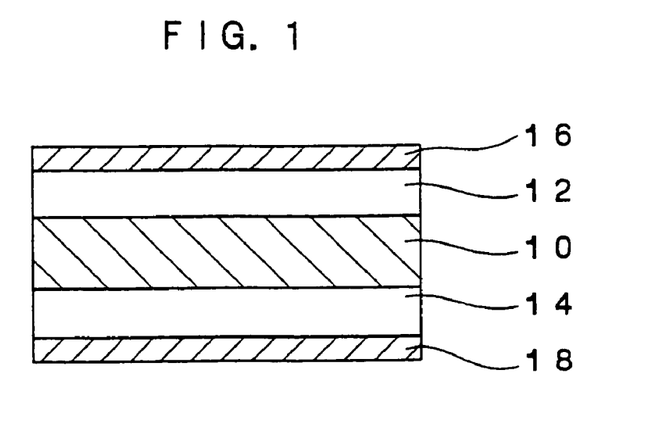
FIG. 1 is a partial cross sectional view showing a layered construction of the holographic recording medium according to a first embodiment of the present invention.

The holographic recording medium of a first embodiment, as shown in FIG. 1, includes: an optical recording layer 10 capable of recording a hologram; a pair of transparent substrates 12 and 14 sandwiching the optical recording layer 10; and optical filter layers 16 and 18, formed respectively on the surfaces of the transparent substrates 12 and 14. The optical filter layers 16 and 18 allows transmission of a predetermined wavelength of a writing light and a predetermined wavelength of a reading light, while blocking light having a wavelength shorter than the wavelength of the writing light.

A hologram is recorded on the holographic recording medium by inducing optical anisotropy by irradiating the writing light, having a predetermined wavelength, and comprising a signal beam and reference beam onto the optical recording layer 10. The recorded hologram is reproduced by irradiating the reading light of a predetermined wavelength onto the optical recording layer 10. Since the holographic recording medium is formed by symmetrically sandwiching the optical recording layer 10, the writing and reading lights may be irradiated from either the side of the transparent substrate 12 or 14.

A transparent plastic substrate may be used as the transparent substrates 12 and 14. In this case "transparent" means that the substrate is transparent to both the writing light and reading light. Examples of the plastic substrate materials include: polycarbonate; acrylic resins such as polymethyl methacrylate; vinyl chloride resins such as polyvinyl chloride and polyvinyl chloride copolymers; epoxy resins; amorphous polyolefins; and polyesters. Polycarbonate is particularly preferable from the view point of moisture resistance, dimensional stability and cost.

The thickness of the transparent substrates 12 and 14 is preferably in a range of 0.1 to 1 mm. It is also preferable to form a tracking guide groove, or projection and dents representing address signal or other information (pre-groove), in one of the transparent substrates 12 or 14. These transparent substrates 12 and 14 can be manufactured by injection molding into a predetermined shape, by injecting a molten resin into a mold.

The optical recording layer 10 comprises photosensitive material containing one of: a polymer compound having photoisomerizable groups in the side chain thereof; and a polymer compound in which photoisomerizable molecules have been dispersed. Change in light-induced birefringence is caused in these materials in accordance with the polarization state of incident light, and the hologram can be recorded by the changes in light-induced birefringence corresponding to a polarized light distribution. Molecules containing an azobenzene skeleton are favorably used as the photoisomerizable groups or photoisomerizable molecules.

The principle of light-induced birefringence will be described below with reference to azobenzene. Azobenzene exhibits cis-trans photoisomerization by irradiating with light. Trans isomer molecules of azobenzene are dominant in the optical recording layer before irradiating the optical recording layer with light. These molecules are randomly oriented, and the material is macroscopically isotropic. When linearly polarized light is irradiated onto the optical recording layer from a given direction (indicated by an arrow in the drawing below), a trans isomer 1 having an absorption axis in the same direction as the direction of polarization of the light, is selectively photoisomerized into the cis isomer. A molecule which has been relaxed into trans isomer 2, having an absorption axis perpendicular to the direction of polarization of the light, does not absorb light any more, and is fixed in that state. Consequently, at a macroscopic level, anisotropy in absorption coefficients and refractive indices, is induced. In other words, dichroism and birefringence are induced.

Such properties usually called light-induced dichroism, light-induced birefringence, or light-induced anisotropy. These excited states of anisotropy can be quenched by irradiating with circularly polarized light or non-polarized light.

Excitation light / Linearly polarized light / trans1 cis / trans2

The polymer compound having photoisomerizable groups in the side chain thereof, or the polymer compound in which photoisomerizable molecules are dispersed, also changes the orientation of the polymer compound itself by photoisomerization, and is able to induce a large degree of birefringence. Birefringence thus induced is stable at temperatures not exceeding the glass transition temperature of the polymer compound, and is favorable for recording the hologram.

Preferable example of a material for constituting the optical recording layer 10 include a polyester having azobenzene groups in the side chain thereof represented by general formula (1) below (which polyester will be referred to as "azopolymer" hereinafter). This polyester is able to record the intensity and the direction of polarization of the signal beam as hologram, due to light-induced anisotropy caused by photoisomerization of azobenzene in the side chain. A polyester having cyanoazobenzene in the side chain is particularly favorable among these polymers. See "Holographic recording and retrieval of polarized light by use of polyester containing cyanoazobenzene units in the side chain", K. Kawano, T. Ishii, J. Minabe, T. Niitsu, Y. Nishikawa and K. Baba, Opt. Lett. Vol. 24 (1999), pp 1269-1271, the disclosure of which is incorporated by reference herein.

In the above formula, X represents a cyano group, methyl group, methoxy group or nitro group; Y represents a divalent linking group by ether linkage, ketone linkage or sulfone linkage; l and m represent integers in a range of 2 to 18, more preferably in a range of 4 to 10; and n represents an integer of in a range of 5 to 500, more preferably in a range of 10 to 100.

The thickness of the optical recording layer 10 is preferably in a range of 0.1 to 5 mm. A recording capacity necessary for recording the hologram cannot be ensured when the thickness of the optical recording layer is less than 0.1 mm, while absorption loss increases when the thickness of the optical recording layer exceeds 5 mm. For further increasing the recording capacity, the thickness of the optical recording layer 10 is preferably in a range of approximately 0.2 to 5 mm, more preferably in a range of approximately 0.5 to 5 mm.

The optical recording layer 10 is formed by injection molding as a molding which is to function as an optical recording layer. The resulting molding is sandwiched between the pair of transparent substrates 12 and 14 and hot-melt adhesion is effected therebetween by using a hot press, so that the optical recording layer 10 interposed between the transparent substrates 12 and 14 is formed.

Chemical Formula (1)

Figure 2:
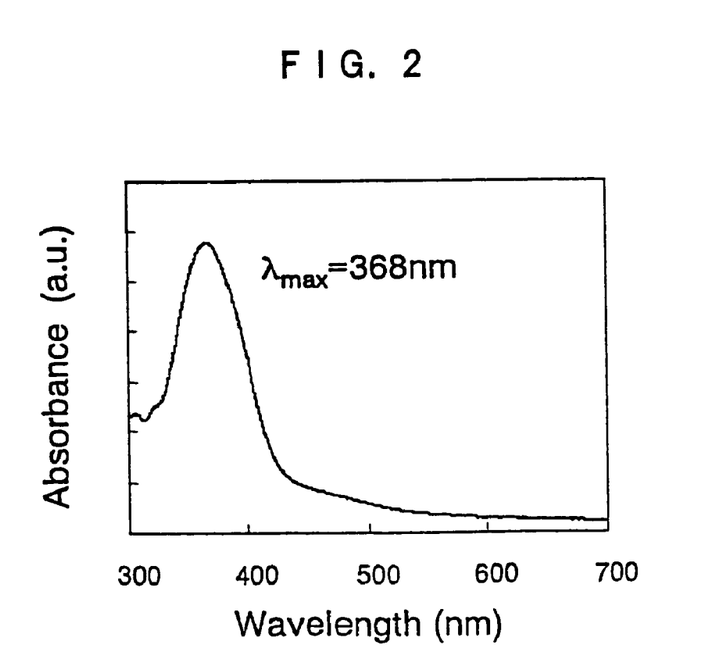
FIG. 2 is a graph showing the relation between an absorption spectrum of the optical recording layer comprising the azo-polymer represented by the chemical formula (2), and the wavelength of the writing light.

The optical recording layers 16 and 18 have a filter function for allowing transmission of the reading light and writing light, while blocking light having a shorter wavelength than the wavelength of the writing light. As shown in FIG. 2, the absorption spectrum of the optical recording layer comprising, for example, the azo-polymer represented by the chemical formula (2) has a maximal value at 368 nm.

Chemical Formula (2)

Since the light absorption ratio of the optical recording layer is greatest at the wavelength of maximum absorption, the largest optical anisotropy may be induced at this wavelength. However, the wavelength of the writing light is selected to be around 532 nm, at the longer wavelength side from the maximum absorption wavelength, when the recording medium has a certain extent of thickness and the writing light may not be effectively utilized due to absorption within the film. The wavelength of the reading light is usually selected as the same wavelength or longer than the wavelength of the writing light.

Accordingly, there are no problems in recording and reproduction of the hologram when light having a shorter wavelength than the wavelength of the writing light is blocked. Blocking light having a shorter wavelength than the wavelength of the writing light, by the optical filter layers, enables the absorption ratio of the optical recording layer to be remarkably reduced. Since light having a shorter wavelength than the wavelength of the writing light is blocked by providing the optical filter layers, the recorded hologram is not destroyed even by exposing the holographic recording medium to external light containing white light components such as the sunlight and the like. This means that the data can be retained for a long period of time.

While an example for setting the wavelength of the writing light at around 532 nm has been described above, the appropriate wavelength of the writing light is determined depending on the absorption spectrum of the recording material constituting the optical recording layer. The wavelength of the writing light when an azo-polymer is used as the recording material is generally 488 nm, 514.5 nm, 532 nm, or similar.

The optical filter layers 16 and 18 may be constituted of either: absorption filters that selectively absorb light having a shorter wavelength than the wavelength of the writing light; or reflection filters that selectively reflect light having a shorter wavelength than the wavelength of the writing light. Photoisomerization may be accelerated by the heat generated as a result of light absorption in absorption filters. Accordingly, the reflection filter, with no heat generation, is preferable for improving the data retention ability. The reflection filter is also advantageous in that there is high transmittance at a transmission wavelength, such as the wavelength of the writing light.

A resin film containing a light absorbing agent, having absorption in the wavelength region to be blocked, may be used as the absorption filter. Examples of such a light absorption agent iclude UV absorbing agents and dyes. In the case of a writing light having a wavelength of 532 nm, examples of favorably used light absorbing agents include: UV absorbing agents such as 2-hydroxybenzophenone, 2-hydroxybenzotriazole, salicylate ester, and the like; and dyes with the edge of the absorption spectrum, on the long wavelength side, in the vicinity of 532 nm, such as cyanine dyes, streptocyanine dyes, merocyanine dyes, oxonol dyes, arylidene dyes, xanthene dyes, azo dyes and coumarin dyes and the like. Examples of resins which can be used include UV curable resins, visible light curable resins and thermosetting resins. The UV absorbing agents usually absorb light in a wavelength range of 200 to 400 mm.

Color filters prepared by dissolving or dispersing a colorant in a resin may be used as the absorption filter. The colorants which can be used for this purpose are pigments, dyes, and the like, having absorption of wavelengths in the region to be blocked.

As the reflection filter, a dielectric multilayer film, which is one type of interference filter having high transmittance to light at a given wavelength or wavelength region, together with a narrow band of transmission wavelengths, may be used. The dielectric multilayer film is prepared by alternately laminating low refractive index dielectric layers and high refractive index dielectric layers, each having an optical thickness of $\frac{1}{4}\lambda$ ($d=\frac{1}{4}\lambda \cdot n$), with spacer layers of $\frac{1}{2}\lambda$ thickness interposed therebetween.

For example, when a $MgF_2$ layer with a refractive index of 1.38 is used as the low refractive index layer (L-layer) and ZnS layer with a refractive index of 2.35 is used as the high refractive index layer (H-layer), the thickness of the L-layer is 96.4 nm while the thickness of the H-layer is 56.6 nm when $\lambda=532$ nm. A dielectric multilayer film that selectively transmit only a light having a wavelength of 532 nm can be obtained by laminating the L-layer and H-layer on the substrate so as to satisfy the following order.

air layer/H-layer, L-layer, H-layer, L-layer, H-layer, H-layer, L-layer, H-layer, L-layer, H-layer/substrate The optical filter layers 16 and 18 are preferably also provided with a filter function for blocking longer wavelength light than the wavelength of the writing light, from the view point of reducing the light absorption ratio of the optical recording layer.

The filter layers 16 and 18 may be formed by being integrated with the respective transparent substrates sandwiching the optical recording layer 10, or formed by coating each surface of the transparent substrates with filter material of a given thickness. Alternatively, the filter layers 16 and 18 may be formed by bonding a previously formed optical filter onto each surface of the transparent substrate.

As described above the holographic recording medium according to the present embodiment comprises an optical recording layer, which optical recording layer contains one of a polymer compound having photoisomerizable groups in the side chain thereof and a polymer compound in which photoisomerizable molecules are dispersed. Therefore, the hologram can be recorded by inducing optical anisotropy by irradiation with the writing light having a predetermined wavelength, while the data is remaind rewritable by taking advantage of reversible photoisomerization.

The optical filter layers are provided on each surface of the pair of transparent substrates sandwiching the optical recording layer, and the optical filter layers allows transmission of the writing light and reading light, while blocking a light having a wavelength shorter than the wavelength of the writing light. Accordingly, the light absorption ratio of the optical recording layer can be reduced without interfering with the writing and reading of the hologram. Consequently, the hologram recorded in the optical recording layer is able to retain the data for a long period of time, without being destroyed by the external light such as the sunlight. For example, the data retention ability is improved 100 times by providing the optical filter layer, as compared with providing no optical filter layer, when the data retention ability is measured using a xenon weatherometer, which xenon weatherometer enables accelerated testing of weather resistance under pseudo-sunlight irradiation (for example, SOLARBOX Xe, manufactured by CO. FO. ME. GRA Co.).

Figure 3:
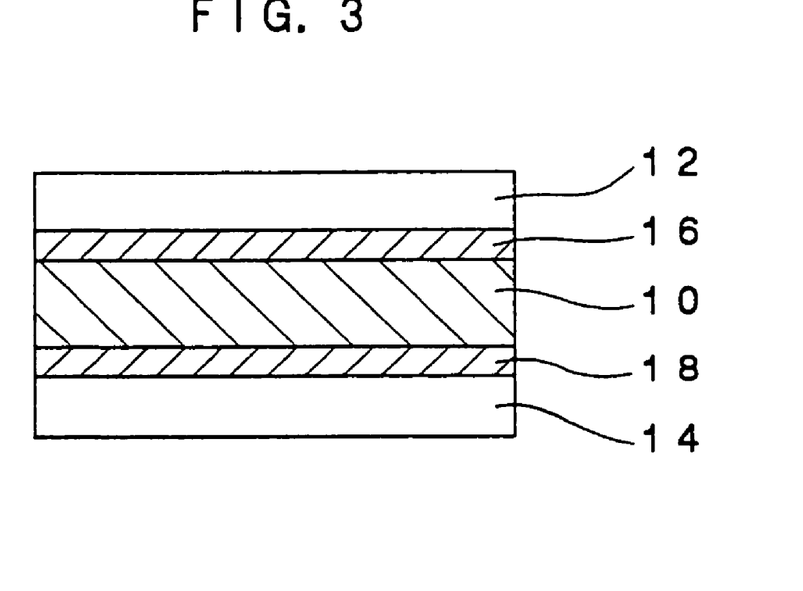
FIG. 3 is a partial cross sectional view showing another layered construction of the holographic recording medium.
Figure 4:
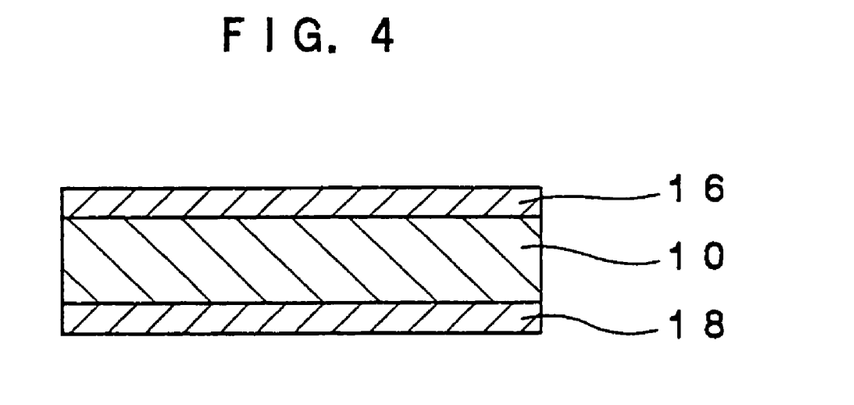
FIG. 4 is a partial cross sectional view showing a yet another layered construction of the holographic recording medium.

While an example in which the optical filter layers 16 and 18 are formed on respective surfaces of the pair of transparent substrates 12 and 14 sandwiching the optical recording layer 10 has been described in the present embodiment, the optical filter layer 16 may be provided between the optical recording layer 10 and transparent substrate 12, as shown in FIG. 3. Similarly, the optical filter layer 18 may be provided between the optical recording layer 10 and transparent substrate 14. The transparent substrate is not an essential component. As shown in FIG. 4, the optical recording layer 10 may be sandwiched between the optical filter layers 16 and 18 without providing any transparent substrates.

SECOND EMBODIMENT

Figure 5:
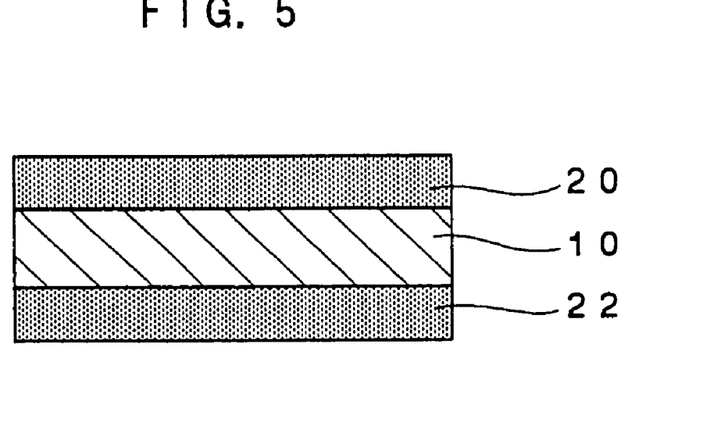
FIG. 5 is a partial cross sectional view showing a layered construction of the holographic recording medium according to a second embodiment of the invention.

The holographic recording medium according to the present embodiment is a laminate comprising an optical recording layer 10 capable of recording a hologram, and a pair of filter substrates 20 and 22 sandwiching the optical recording layer 10 (See FIG. 5). The same reference numerals are given to the same components as in the holographic recording medium in the first embodiment, and descriptions thereof will be omitted.

The filter substrates 20 and 22 have a filter function for allowing transmission of the writing light and reading light, while blocking a light having a shorter wavelength than the wavelength of the writing light. The filter substrates 20 and 22 preferably also have a filter function for blocking light having a longer wavelength than the wavelength of the writing light, from the view point of reducing the light absorption ratio of the optical recording layer.

Plastic substrates containing colorants dissolved or dispersed therein may also be used as the filter substrates 20 and 22, as in the absorption filter described above. The known dyes and pigments that absorb light having the wavelengths to be blocked can be used as the colorants. Commercially available color filters, and the like, may also be used. Examples of the material of the plastic substrate include, as in the transparent substrate: polycarbonate; acrylic resins, such as polymethy methacrylate and the like; vinyl chloride resins, such as polyvinyl chloride, and vinyl chloride copolymers; epoxy resins; amorphous polyolefins; and polyesters. Polycarbonate is particularly preferable from the view points of moisture resistance, dimensional stability and cost.

When the filter substrates 20 and 22 are absorption filters, the filter substrates 20, 22 can be manufactured into a desired shape by injection molding, i.e., by injecting a molten resin into a mold. The thickness of the substrate is preferably approximately 0.1 to 1 mm. The optical recording layer 10 can be formed by molding injection as a molding which is to function as an optical recording layer. The resulting molding is then sandwiched between a pair of filter substrates and hot-melt adhesion is effected therebetween by using a hot-press, so that the optical recording layer 10 sandwiched between the filter substrates 20 and 22 is formed.

The filter substrates 20 and 22 may also comprise dielectric multilayer films, as in the reflection filter described in the foregoing embodiment. The filter substrates 20 and 22 as dielectric multilayer films may be formed by laminating dielectric substances onto the surface of the optical recording layer 10. In this case the thickness of the substrates is preferably in a range of 0.1 to 5 mm.

As described above, the holographic recording medium according to the present embodiment comprises the pair of filter substrates sandwiching the optical recording layer. The filter substrates allows transmission of the writing light and reading light, while blocking a light having a shorter wavelength than the wavelength of the writing light. Consequently, the light absorption ratio of the optical recording layer may be reduced, without interfering with writing and reading of the hologram. Accordingly, the hologram, recorded in the optical recording layer, is able to retain the data for a long period of time without being destroyed by the external light, such as the sunlight. For example, the data retention ability, as measured in a xenon weatherometer, is improved 100 times by providing the filter substrate, as compared with providing no filter substrate.

Since the substrate also provides a filter function, a process for forming the optical filter layer is not needed, and there is a benefit that the production cost is reduced.

THIRD EMBODIMENT

Figure 6:
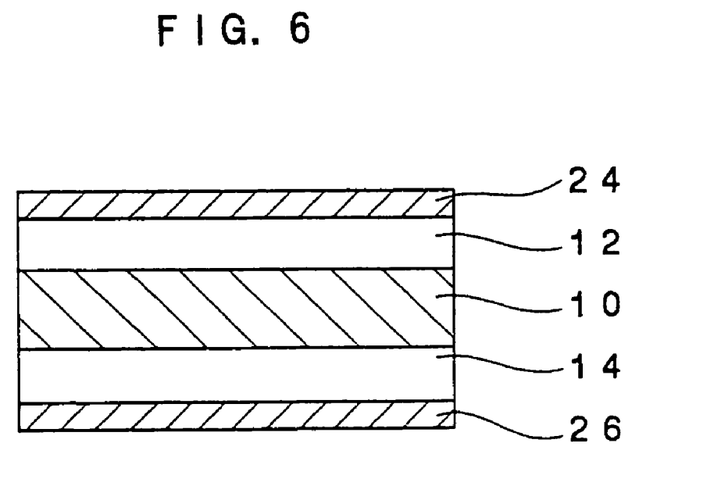
FIG. 6 is a partial cross sectional view showing a layered construction of the holographic recording medium according to a third embodiment of the invention.

The holographic recording medium according to the present embodiment comprises, as shown in FIG. 6, a laminate comprising: an optical recording layer 10 capable of recording a hologram; a pair of transparent substrates 12 and 14, sandwiching the optical recording layer 10; a first optical filter layer 24 formed on the surface of the transparent substrate 12, for allowing transmission of a writing light having a predetermined wavelength and for blocking light having a shorter wavelength than the wavelength of the writing light; and a second optical filter layer 26 formed on the surface of the transparent substrate 14, for allowing transmission of a reading light having a predetermined wavelength and for blocking light having a shorter wavelength than the wavelength of the reading light. The same reference numerals are given to the same components as in the holographic recording medium in the first embodiment, and descriptions thereof will be omitted.

The hologram is recorded on this holographic recording medium by inducing optical anisotropy by irradiating the writing light having a predetermined wavelength, the writing light including a signal beam and reference beam, onto the optical recording layer 10, from the transparent substrate 12 side, through the first optical filter layer 24. The recorded hologram is reproduced by irradiating the reading light having a predetermined wavelength onto the optical recording layer 10, from the transparent substrate 14 side, through the second optical filter layer 26.

The first optical filter layer 24 transmits the writing light, and has a filter function for blocking light having a shorter wavelength than the wavelength of the writing light. The wavelength of the writing light is selected, as has been described above, to be at the longer wavelength side of the wavelength of maximum absorption of the material constituting the optical recording layer. The hologram is recorded on this holographic recording medium by inducing optical anisotropy by irradiating the writing light having a predetermined wavelength, onto the optical recording layer 10 from the transparent substrate 12 side, through the first optical filter layer 24. Accordingly, there is caused no problem in hologram recording when light having a shorter wavelength than the wavelength of the reading light is blocked. In addition, the light absorption ratio of the optical recording layer can be remarkably reduced by blocking light having a shorter wavelength than the wavelength of the writing light with the first optical filter layer.

The second optical filter layer 26 has a filter function for transmitting the reading light, and for blocking light having a shorter wavelength than the wavelength of the reading light. As has been described above the wavelength of the reading light is usually selected to be the same as or longer than the wavelength of the writing light. The recorded hologram is reproduced from the holographic recording medium by irradiating a reading light, having a predetermined wavelength, onto the optical recording layer 10, from the transparent substrate 14 side, through the second optical filter layer 26. Accordingly, there is no problem when light having a shorter wavelength than the wavelength of the reading light is blocked. In addition, light absorption ratio of the optical recording layer can be remarkably reduced by blocking light having a shorter wavelength than the wavelength of the reading light with the second optical filter layer.

The first optical filter layer 24 and the second optical filter layer 26 may be either the absorption filter or the reflection filter, as in the optical filter layers in the first embodiment. Alternatively, one of the first optical layer 24 and second optical filter layer 26 may be the absorption filter, while the other of them may be the reflection filter.

The first optical filter layer 24 is formed on the writing light irradiating side surface of the pair of transparent substrates sandwiching the optical recording layer. Since this first optical filter layer transmits the writing light, while blocking light having a shorter wavelength than the wavelength of the writing light, the light absorption ratio of the optical recording layer may be reduced, without interfering with the writing of the hologram.

The second optical filter layer is formed on the reading light irradiating side surface of the pair of transparent substrates, and this second optical filter layer transmits the reading light, while blocking light having a shorter wavelength than the wavelength of the reading light. Consequently, the light absorption ratio of the optical recording layer may be reduced, without interfering with the reading of the hologram. Note that, when the wavelength of the reading light is selected to be longer than the wavelength of the writing light, the second optical filter layer blocks light having a wider range of wavelengths than the first optical filter layer does, whereby the light absorption ratio of the optical recording layer can be further reduced.

As hiterto described, the hologram recorded on the optical recording layer is not destroyed by external light such as the sunlight, thereby enabling the data to be retained for a long period of time, since the light absorption ratio of the optical recording layer is reduced by providing the first optical filter layer and second optical filter layer. For example, the data retention ability as measured with a xenon weatherometer is improved 100 times or more by providing the first optical filter layer and second optical filter layer, as compared with the case in which these optical filter layers are not provided.

EXAMPLES

While the invention is described in detail hereinafter with reference to examples, the invention is by no means restricted to these examples.

Example 1

The azo-polymer (polyester having cyanoazobenzene in the side chain thereof; Tg=38° C., Mw=20,749, Mn=9,696) as a raw material of the optical recording layer represented by the chemical formula (2) is dissolved in THF (tetrahydrofuran) in a concentration of 0.1% by weight, and the solution is filtered with a 0.2 micron diameter membrane filter. Flakes of the azo-polymer are obtained by removing the solvent under a reduced pressure of 10,000 Pa.

Two transparent disks of polycarbonate substrates with a thickness of 0.6 mm and a diameter of 120 mm are prepared, and the flakes of the azo-polymer are sandwiched between the two substrates while a predetermined quantity of the flakes (about 10 g assuming that the specific gravity thereof is 1) is uniformly distributed between the substrates. This laminate is hot-pressed with a load of 10 kg/cm$^2$ under a reduced pressure of 10,000 Pa at 70° C. for 10 minutes. Hot-pressing is continued for additional 10 minutes at a load of 10 kg/cm$^2$ under atmospheric pressure, with increasing the temperature to 130° C., followed by spontaneous cooling to room temperature.

Then, the recording medium is made to be transparent by heating to 70° C. followed by quenching to 10° C. A laminate comprising an optical recording layer sandwiched between the pair of substrates is obtained by the procedures above.

Subsequently, 1 g of 2-hydroxybenzophenone (2-hydroxybenzophenone manufactured by Aldrich Corporation) is added to 100 g of an acryl-silicone resin (trade name "High Tentop Clear" manufactured by Shinto Paint Co., Ltd.) to prepare a resin for forming an optical filter layer. This resin is applied on the surface of one of the transparent substrates of the laminate by spin coating to form an optical filter layer with a thickness of 50 µm. Another optical filter layer with a thickness of 50 µm is formed on the surface of another transparent substrate of the laminate by the same method. These optical filter layers block light in the UV region (generally, light with a wavelength in the region of 200 to 400 nm).

A holographic recording medium, having the layered construction as shown in FIG. 1, provided with an absorption filter is obtained by the process as described above.

Example 2

L-layers of MgF$_2$, with a refractive index of 1.38 and a thickness of 96.4 nm, and H-layers of ZnS, with a refractive index of 2.35 and a thickness of 56.6 mm, are laminated onto the surface of a pair of the transparent substrates of the laminate, obtained by the same method as Example 1, so that the L- and H-layers satisfy the order described below. An optical filter layer having a thickness of 0.725 µm, constituted of dielectric multi-layer films, is formed. This optical filter layer selectively transmits only light with a wavelength of 532 nm, and blocks other light.

air layer/H-layer, L-layer, H-layer, L-layer, H-layer, H-layer, L-layer, H-layer, L-layer, H-layer,/substrate A hologram recording medium, having the layer construction as shown in FIG. 1 and provided with a reflection filter, is obtained by the process described above.

Example 3

A hologram recording medium, having an optical recording layer sandwiched between a pair of filter substrates is prepared by the same method as in Example 1, except that color filters (trade name "Sharp Cut Filter Y-50", manufactured by Hoya Candeo Optronics Co.) with a thickness of 0.5 mm are used as the paired substrates. The transmitting wavelength limit of this color filter is about 500 nm, and light having a wavelength shorter than this wavelength limit is blocked.

Comparative Example 1

A holographic recording medium is manufactured by the same method as in example 1, except that no filter layers are provided. The holographic recording medium of Comparative Example 1 is a laminate comprising an optical recording layer sandwiched between a pair of transparent substrates.

[Evaluation of Data Retention Ability]

A hologram is recorded on each of the recording media of the examples and comparative example described above by irradiating it with a recording light (comprising a signal beam and reference beam) with an illuminance of 1 W/cm$^2$ and a wavelength of 532 nm. Then, a white light is irradiated on each of the recording media on which a hologram has been recorded, for a predetermined time at an illuminance of 1 kW/m$^2$ (a light intensity corresponding to the sunlight on the surface of the ground) using a weatherometer "SOLARBOX Xe" manufactured by CO. FO. ME. GRA Co.

A reproduction light with a wavelength of 532 nm is irradiated on each recording medium after the weather resistance test, with an illuminance of 1 W/cm$^2$, to obtain diffraction light from the recorded hologram. The weather resistance test and measurement of the diffraction light intensity are repeated, and the time until 50% reduction in light intensity of the diffraction light (relative to the intensity of the diffraction light measured before the weather resistance test) is measured to evaluate the data retention ability. The results are shown in Table 1.

TABLE 1

| Sample | Time required for 50% reduction in intensity of Diffraction Light |
|---|---|
| Example 1 | 2000 hours |
| Example 2 | 3500 hours |
| Example 3 | 4500 hours |
| Comparative Example 1 | 18 hours |

Table 1 shows that the data retention ability of the hologram recording medium of the present examples comprising the optical recording layer is remarkably improved, as compared with that of the hologram recording medium having no optical filter layer.

In summary, the present invention provides a data-rewritable holographic recording medium which is excellent in data retention ability, and a recording method using the holographic recording medium.

What is claimed is:

1. A holographic recording medium comprising:
an optical recording layer, which optical recording layer includes one of a polymer compound having photoisomerizable groups in the side chain thereof and a polymer compound in which photoisomerizable molecules are dispersed therein, which recording layer records a hologram by having optical anisotropy induced by irradiation with a writing light having a predetermined wavelength thereon;
a first optical filter layer formed on one surface of the optical recording layer, which first optical filter layer allows transmission of the writing light therethrough and blocks light having a shorter wavelength than the wavelength of the writing light; and
a second optical filter layer formed on the other surface of the optical recording layer, which second optical filter layer allows transmission of a reading light, having a predetermined wavelength irradiated on the optical recording layer for reproducing the hologram recorded on the optical recording layer, therethrough and blocks light having a shorter wavelength than the wavelength of the reading light, including the writing light;
wherein each of the first and second optical filter layers comprises a reflection filter that selectively reflects light; and
wherein the wavelength of the reading light is longer than the wavelength of the writing light.

2. A holographic recording medium according to claim 1, wherein the reflection filter is a dielectric multilayer film.

3. A holographic recording method comprising:
forming a first and second optical filter layer respectively on opposite sides of an optical recording layer comprising one of a polymer compound having photoisomerizable groups in the side chain thereof and a polymer compound in which photoisomerizable molecules are dispersed therein, wherein each of the first and second optical filter layers comprises a reflection filter that selectively reflects light;
selecting a wavelength of a reading light to be irradiated on the optical recording layer, for reproducing a hologram which has been recorded on the optical recording layer, to be longer than the wavelength of a writing light;
using the first and second optical filter layers for respectively transmitting the writing light and the reading light while blocking light having a shorter wavelength than the wavelength of the writing light and light having a shorter wavelength than the reading light, including the writing light, respectively; and,
irradiating the writing light to the optical recording layer to thereby induce optical anisotropy for recording the hologram.

4. A holographic recording method comprising:
forming a first and second optical filter layer respectively on opposite sides of an optical recording layer, which optical recording layer includes one of a polymer compound having photoisomerizable groups in the side chain thereof and a polymer compound in which photoisomerizable molecules are dispersed therein, wherein each of the first and second optical filter layers comprises a reflection filter that selectively reflects light;

allowing, by way of the first and second optical filter layers, respectively transmitting a writing light having a predetermined wavelength and a reading light having a predetermined wavelength that is longer than the wavelength of the writing light and irradiated on the optical recording layer for reproducing a hologram recorded on the optical recording layer, while respectively blocking, by the first and second optical filter layers, light having a shorter wavelength than the wavelength of the writing light and light having a shorter wavelength than the reading light, including the writing light, respectively; and irradiating the optical recording layer with the writing light, thereby inducing optical anisotropy for recording the hologram.

* * * * *